(12) United States Patent
Ohtani

(10) Patent No.: US 6,765,832 B1
(45) Date of Patent: Jul. 20, 2004

(54) SEMICONDUCTOR MEMORY DEVICE WITH WORD LINE SHIFT CONFIGURATION

(75) Inventor: Jun Ohtani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/654,899

(22) Filed: Sep. 5, 2003

(30) Foreign Application Priority Data

Mar. 28, 2003 (JP) ....................................... 2003-090234

(51) Int. Cl.[7] .............................................. G11C 7/00
(52) U.S. Cl. ....................... 365/200; 365/201; 365/203; 365/230.6; 365/230.08; 365/189.08; 365/185.23
(58) Field of Search ................................ 365/200, 201, 365/203, 230.6, 230.08, 189.08, 185.23

(56) References Cited

U.S. PATENT DOCUMENTS 6,421,286 B1 * 7/2002 Ohtani et al. ............... 365/200
6,545,921 B2 * 4/2003 Ohtani et al. ............... 365/201

FOREIGN PATENT DOCUMENTS

JP P2002-15592 A 1/2002

* cited by examiner

*Primary Examiner*—Connie C. Yoha
(74) *Attorney, Agent, or Firm*—McDermott Will & Emery LLP (57) ABSTRACT

In each word line driver, an output node is precharged to a power supply voltage prior to a row select operation and disconnected from the power supply voltage in the row select operation. Further, each first node is connected to a corresponding second node selectively driven to a ground voltage according to a row address through a control switch that is turned on in the row select operation. In each shift switch, output nodes corresponding to word lines other than a defective word line and spare word lines are connected to a second node of a corresponding word line or a word line adjacent thereto through a plurality of transistor switches selectively turned on in accordance with shift control, respectively.

8 Claims, 8 Drawing Sheets

FIG.10

SEMICONDUCTOR MEMORY DEVICE WITH WORD LINE SHIFT CONFIGURATION

TITLE OF THE INVENTION

Semiconductor Memory Device with Word Line Shift Configuration

BACKGROUND OF THE INVENTION

1. Field of the Invention

The present invention relates to a semiconductor memory device and, more particularly, to a semiconductor memory device executing redundancy repair using a so-called word line shift configuration.

2. Description of the Background Art

As a general defect repair measure in a semiconductor memory device, a word line redundancy configuration has been known in which a defective memory cell is repaired on the basis of a memory cell row as a unit by controlling selection of a spare word line provided correspondingly to spare memory cells arranged so as to form a spare row, and a word line provided correspondingly to a normal cell row.

Especially, in such a word line redundancy configuration, a word line shift configuration has been known in which a so-called shift redundancy is applied. In a configuration disclosed in FIG. 1 of Japanese Patent Laying-Open No. 2002-15592, for example, each of word line select circuits 11 provided correspondingly to respective word lines drives a corresponding word line into a selected state or a non-selected state according to a voltage at an output node 32. A shift switch 38 capable of connecting to output node 32 of another word line select circuit 11 is provided in the interior of each of word line select circuits 11, thereby realizing a word shift configuration in which a defective word line is replaced with an adjacent word line and, also, the subsequent word lines are sequentially shifted to use a spare word line.

Generally, in the word line redundancy configuration, a spare row is arranged in the outermost end of a memory cell array. Therefore, in the case where a defective row is directly replaced with a spare row, a difference in access time between a replacement of the defective row and each of the other memory cell rows become larger. On the other hand, in the word line shift configuration in which a defective word line is replaced with an adjacent word line, a difference in access time when the defective row is selected can be reduced.

Further, in the word line shift configuration in which a shift redundancy scheme is adopted, shift states of a spare word line and word lines can be predetermined according to a location of a defective row; therefore, no need arises for a redundancy decoder, leading to an advantage in that no necessity occurs for executing a redundancy determination in each access. As a result, a memory access at a high speed is realized in the shift redundancy configuration as compared with the case where the redundancy decoder is employed without adopting the shift redundancy configuration.

On the other hand, when an unintentional variation occurs in voltage at an output node controlling selection/non-selection of a corresponding word line (e.g. an output node 32 in FIG. 1 of the above publication) regardless of a redundancy configuration in a word line select circuit, an unexpected word line is selected, resulting in simultaneous selection of a plurality of word lines in error, that is "multi-word line selection." When the multi-word line selection occurs, neither data reading nor data writing is normally executed.

In the above word line shift configuration, however, in each word line select circuit, unavoidable increase arises in the number of electric paths connected to the above output node due to arrangement of shift switches. Hence, with the word line shift configuration adopted, a risk of multi-word line selection is enhanced

SUMMARY OF THE INVENTION

It is an object of the present invention to provide a semiconductor memory device with a word line shift configuration having less of a risk of word line multi-selection.

A semiconductor memory device according to one aspect of the present invention includes: a memory cell array including a plurality of memory cells arranged in rows and columns and a plurality of spare memory cells arranged so as to form first and second spare rows in respective regions adjacent to the plurality of memory cells; a plurality of word lines provided correspondingly to respective rows of the plurality of memory cells; first and second spare word lines provided correspondingly to the first and second spare rows, respectively; a plurality of word line drivers provided correspondingly to the respective plurality of word lines to each control a voltage on a corresponding one of the plurality of word lines; and first and second spare word line drivers provided correspondingly to the first and second spare word lines, respectively, to control voltages on the first and second spare word lines, wherein the plurality of word line drivers and the first and second spare word line drivers are sequentially disposed in accordance with arrangement of the plurality of word lines and the first and second spare word lines in the memory cell array, each of the plurality of word line drivers and the first and second spare word line drivers includes: an output node; a drive circuit driving a corresponding one of the plurality of word lines and the first and second spare word lines into one of a selected state and a non-selected state according to a voltage at the output node; and a precharge switch precharging the output node to a first voltage prior to a row select operation and, also, disconnecting the output node from the first voltage in the row select operation, each of the plurality of word line drivers further includes: a decode unit connecting a first internal node to a second voltage in the row select operation according to a result of row selection; a control switch provided between a second internal node and the first internal node to connect both to each other in the row select operation and, also, disconnect both from each other prior to the row select operation; a first shift switch connected between one output node adjacent to the output node of a corresponding one of the plurality of word line drivers on a first side along a direction of arrangement of the plurality of word line drivers and the first and second spare word line drivers, and the second internal node of the corresponding word line driver; a second shift switch connected between the output node of the corresponding word line driver, and the second internal node of the corresponding word line driver; and a third shift switch connected between one output node adjacent to the output node of the corresponding word line driver on a second side opposite to the first side, and the second internal node of the corresponding word line driver, and the semiconductor memory device further includes a shift control circuit controlling turning-on and -off of the first to third shift switches in each of the plurality of word line drivers in the row selection operation on the basis of an address of a defective memory cell row.

A semiconductor memory device according to another aspect of the present invention includes: a memory cell array including a plurality of memory cells arranged in rows and columns and a plurality of spare memory cells arranged so as to form J spare rows (where J is a natural number); a plurality of word lines provided correspondingly to respective rows of the plurality of memory cells; J spare word lines provided correspondingly to the respective J spare rows; a plurality of word line drivers provided correspondingly to the respective plurality of word lines to each control a voltage on a corresponding one of the plurality of word lines; and J spare word line drivers provided correspondingly to the respective J spare word lines to each control a voltage on a corresponding one of the spare word lines, wherein the plurality of word line drivers and the J spare word line drivers are sequentially arranged in accordance with arrangement of the plurality of word lines and the J spare word lines in the memory cell array, each of the plurality of word line drivers and the J spare word line drivers includes: an output node; a drive circuit driving a corresponding word line or a spare word line into one of a selected state and a non-selected state according to a voltage at an output node; and a precharge switch precharging the output node to a first voltage prior to a row select operation and, also, disconnecting the output node from the first voltage in the row select operation, each of the plurality of word line drivers further includes: a decode switch connecting a first internal node to a second voltage according to a result of row selection; a control switch provided between the first internal node and a second internal node to connect both to each other in the row select operation and, also, disconnect both from each other prior to the row select operation; and (J+1) shift switches, respectively, provided between the output node of a corresponding of the plurality of word line drivers and output nodes of adjacent J ones among the other word line drivers and the J spare word line drivers, and the second internal node of the corresponding word line driver, and, in the row select operation, one of which is selectively turned on, while the other of which are turned off, and the semiconductor memory device further includes a shift control circuit controlling turning-on and -off of the (J+1) shift switches in each of the plurality of word line drivers in the row selection operation on the basis of an address of a defective memory cell row.

Therefore, a main advantage of the present invention is in that, in a semiconductor memory device, a charge capacitance of the output node can be secured at which there appears a voltage controlling selection/non-selection of a word line and a spare word line. With this configuration, an unintentional variation in voltage at the output node is suppressed, thereby enabling a stable row selection with less of a risk of word line multi-selection to be performed in a word shift configuration as well.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, detailed description will be given of embodiments of the present invention with reference to the accompanying drawings. Note that the same symbols in the figures denote the same or corresponding constituent elements.

First Embodiment

Figure 1:
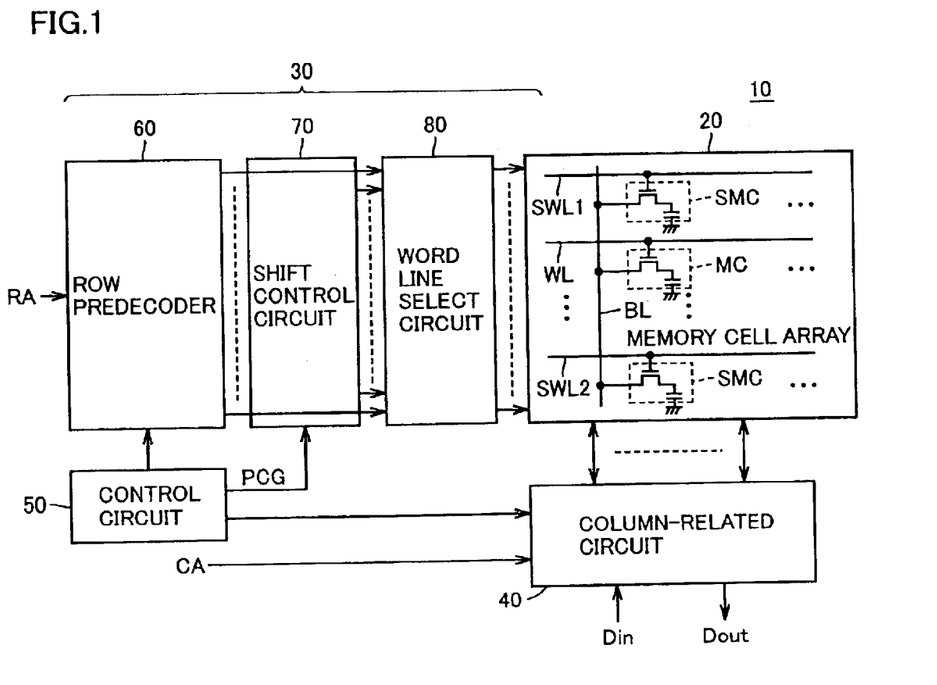
FIG. 1 is a schematic block diagram showing an overall configuration of a semiconductor memory device according to an embodiment of the present invention.

Referring to FIG. 1, a semiconductor memory device 10 according to the present invention includes a memory cell array 20, a row-related circuit 30, a column-related circuit 40 and a control circuit 50, and can execute writing of input data Din and outputting of read data Dout on a memory cell selected according to row address RA and a column address CA.

Memory cell array 20 includes: a plurality of normal memory cells MC arranged in rows and columns; and a plurality of spare memory cells SMC arranged so as to form spare rows, for example, at ends of memory cell array 20. FIG. 1 shows a configuration in which spare memory cells SMC are arranged so as to form spare rows in respective regions outside the arrangement of the plurality of normal memory cells MC. Each spare memory cell SMC is provided for replacing a defective memory cell in the plurality of normal memory cells MC and has a configuration similar to each normal memory cell MC.

Note that, as an example, FIG. 1 shows normal memory cell MC and spare memory cell SMC as a DRAM (Dynamic Random Access Memory) cell of a 1 Tr (transistor)-1 C (capacitor) configuration. However, the present invention can be applied commonly to semiconductor memory devices executing a row selection using a word line regardless of a memory cell type as will be made clear in the following description. That is, the present invention can also be applied to SRAM (Static Random Access Memory), EEPROM (Electrically Erasable/Programmable Read Only Memory) such as a flash memory (R), a magnetic random access memory (MRAM and the like.

Normal memory cells MC and spare memory cells SMC are arranged in rows and columns so as to share memory cell columns over all of memory cell array 20. Word lines WL are arranged correspondingly to respective rows of normal memory cells MC and spare word lines SWL1 and SWL2 are arranged correspondingly to the respective two spare rows. Further, bit lines BL are arranged correspondingly to respective memory cell columns each of which is shared by normal memory cells MC and spare memory cells SMC.

Row-related circuit 30 includes: a row predecoder 60 predecoding a row address RA to generate a predecode signal; a shift control circuit 70 controlling word line shift of spare word lines SWL1 and SWL2, and a word lines WL; and a word line select circuit 80 controlling selection and non-selection of each of word lines WL and spare word lines SWL1 and SWL2.

Column-related circuit 40 collectively indicates a column select circuit executing column selection according to a column address CA, a bit line driver controlling a voltage on or a current in a bit line BL in data reading and data writing, and a sense amplifier. Control circuit 50 generates control signals specifying operation timings of respective circuits according to instruction commands in order to control all of operations in semiconductor memory device 10.

Figure 2:
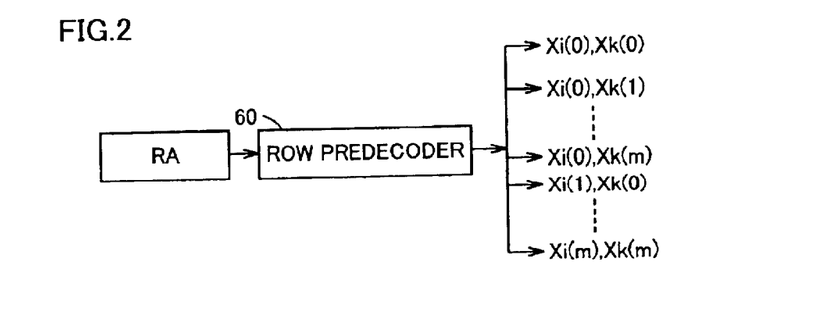
FIG. 2 is a conceptual diagram describing operations in a row predecoder shown in FIG. 1.

Referring to FIG. 2, row predecoder 60 predecodes lower bits of row address RA to generate predecode signals Xi(0) to Xi(m) and predecodes upper bits of row address RA to output predecode signals Xk(0) to Xk(m). Herein, m is a natural number.

While, in application of the present invention, the number of bits of row address RA is optional, description is given of, as an example, a case where row address RA is of six bits and is formed from address bits RA(0) to RA(5). Therefore, row predecoder 60 predecodes lower three bits RA(0) to RA(2) to generate predecode signals Xi(0) to Xi(7), while predecoding upper three bits RA(3) to RA(5) to generate predecode signals Xk(0) to Xk(7). That is, m=7. In this manner, in memory cell array 20 shown in FIG. 1, one of 64 word lines ($2^6$=8×8=64) WL(0) to WL(63) is selected on the basis of six bits row address RA.

Note that, in the following description, predecode signals Xi(0) to Xi(7) are also collectively written as predecode signal Xi, and predecode signals Xk(0) to Xk(7) are also collectively written as predecode signal Xk. Word lines WL(0) to WL(63) are also collectively written as word line WL.

Figure 3:
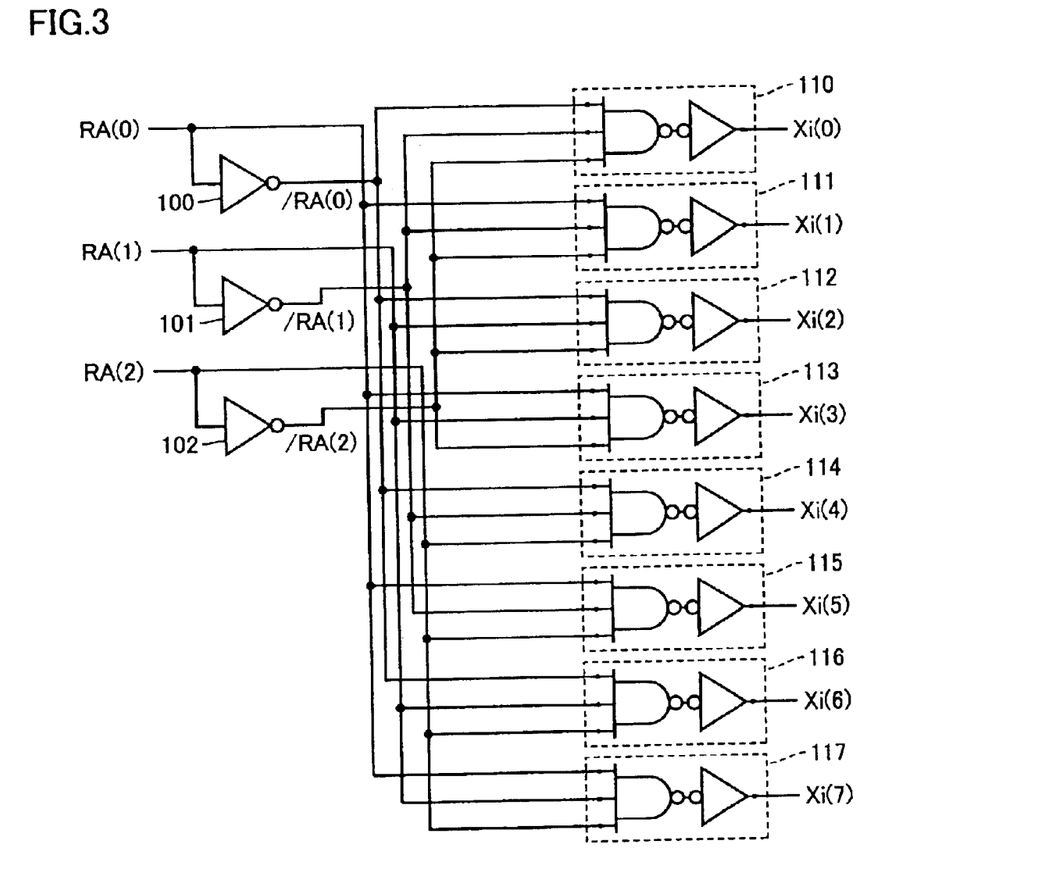
FIG. 3 is a first circuit diagram showing a configuration of the row predecoder.
Figure 4:
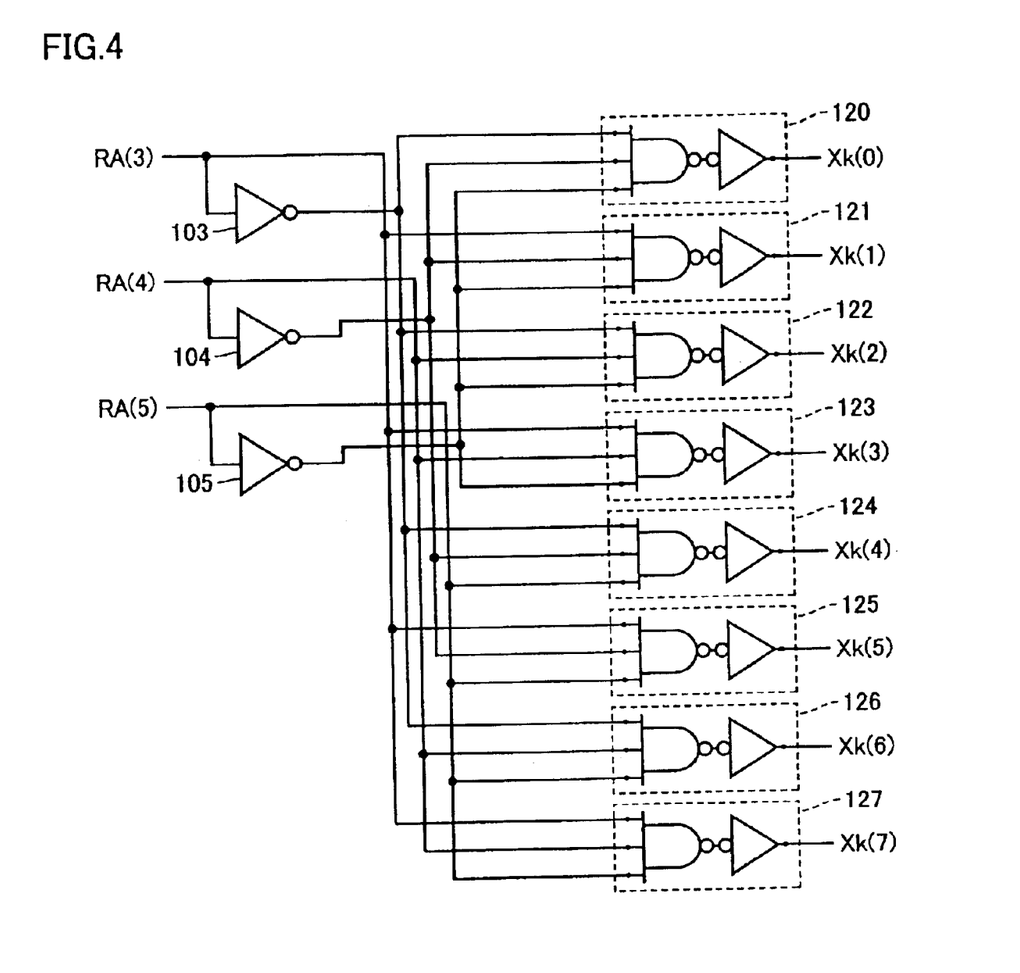
FIG. 4 is a second circuit diagram showing a configuration of the row predecoder.

FIGS. 3 and 4 are circuit diagrams showing a configuration of row predecoder 60.

FIG. 3 shows a configuration in which predecode signals Xi(0) to Xi(7) are generated from lower bits RA(0) to RA(2) of row address RA, and FIG. 4 shows a configuration in which predecode signals Xk(0) to Xk(7) are generated from upper bits RA(3) to RA(5) of row address RA.

Referring to FIG. 3, row predecoder 60 includes: inverters 100 to 102 each generating inverted bits/RA(0) to /RA(2) of row address bits RA(0) to RA(2); and logic circuits 110 to 117 for outputting respective predecode signals Xi(0) to Xi(7). With a connection relationship shown in FIG. 3 adopted, one of predecode signals Xi(0) to Xi(7) is set to a logic high level (hereinafter, also simply referred to as "H level") in correspondence with respective eight combinations of row address bits (RA(0), RA(1), RA(2))=(0, 0, 0) to (1, 1, 1) and the other predecode signals are set to a logic low level (hereinafter, also simply referred to as "L level").

Referring to FIG. 4, row predecoder 60 further includes: inverters 103 to 105 each generating inverted bits/RA(3) to /RA(5) of row address bits RA(3) to RA(5); and logic circuits 120 to 127 for outputting respective predecode signals Xk(0) to Xk(7). With a connection relationship shown in FIG. 4 adopted, one of predecode signals Xk(0) to Xk(7) is set to H level in correspondence with respective eight combinations of row address bits (RA(3), RA(4), RA(5))=(0, 0, 0) to (1, 1, 1) and the other predecode signals are set to L level.

Figure 5:
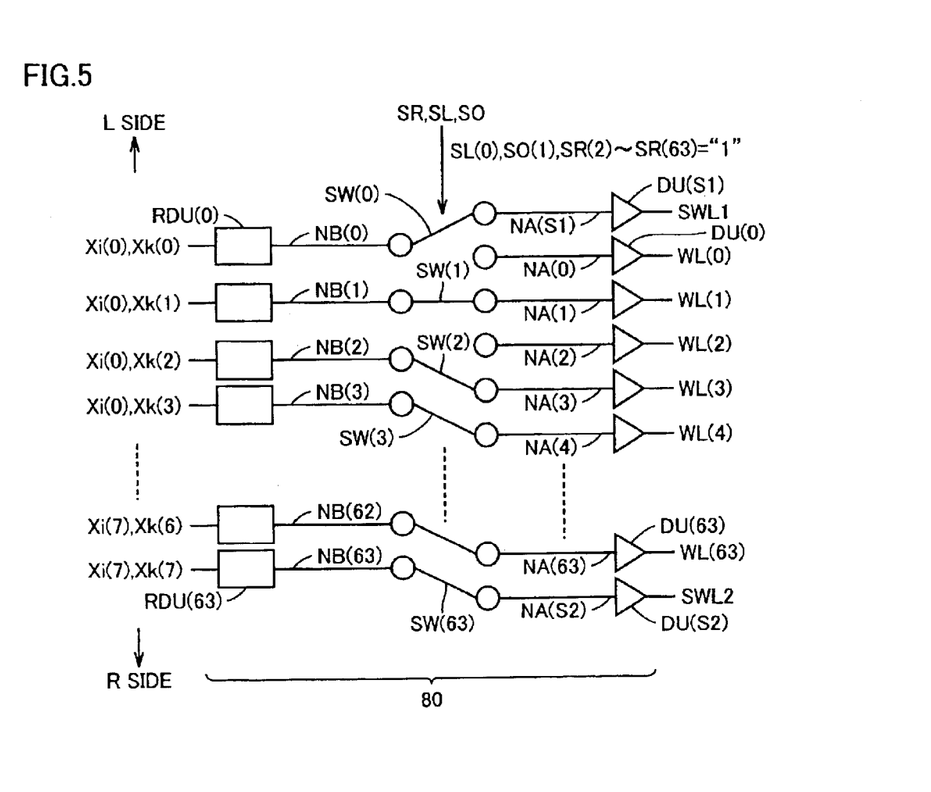
FIG. 5 is a block diagram describing a word line shift configuration according to a first embodiment.

FIG. 5 is a block diagram describing a word line shift configuration according to a first embodiment.

Referring to FIG. 5, word line select circuit 80 shown in FIG. 1 includes: a plurality of drive units DU(0) to DU(63), and DU(S1) and DU(S2) provided correspondingly to word lines WL(0) to WL(63) and spare word lines SWL1 and SWL2, respectively.

Drive units DU(0) to DU(63) drive corresponding word lines WL(0) to WL(63) into one of a selected state and a non-selected state according to respective voltages at output nodes NA(0) to NA(63). Similar to this, drive units DU(S1) and DU(S2) drive corresponding spare word lines SWL1 and SWL2 into one of a selected state and a non-selected state according to respective voltages at output nodes NA(S1) to NA(S2).

In the following description, drive units DU(0) to DU(63), DU(S1) and DU(S2) are collectively written as drive unit DU, and output nodes NA(0) to NA(63), NA(S1) and NA(S2) are also collectively written as output node NA.

Each output node NA is, as will be detailed later, pre-charged so that each word line and each spare word line are fixedly driven into a non-selected state prior to a row select operation while, in the row select operation, being disconnected from the precharge voltage.

Word line select circuit 80 further includes: row decode units RDU(0) to RDU(63) provided correspondingly to respective nodes NB(0) to NB(63); and shift switches SW(0) to SW(63).

In the following description, nodes NB(0) to NB(63), row decode units RDU(0) to RDU(63) and shift switches SW(0) to SW(63) are collectively written as simply node NB, row decode unit RDU and shift switch SW, respectively.

Corresponding predecode signals Xi and predecode signals Xk are inputted to each of row decode units RDU(0) to RDU(63). For example, predecode signals Xi(0) and Xk(0) are inputted to row decode unit RDU(0), predecode signals Xi(0) and Xk(1) are inputted to row decode unit RDU(1), and predecode signals Xi(7) and Xk(7) are inputted to row decode unit RDU(63). When inputted predecode signals Xi and Xk are both at H level, each row decode unit RDU drives corresponding node NB to a prescribed voltage different from a precharge voltage at output node NA.

Row predecoder 60, as described in FIGS. 2 to 4, sets one of predecode signals Xi(0) to Xi(7) and one of predecode signals Xk(0) to Xk(7) both to H level, while setting the other predecode signals to L level. Therefore, with 64 combinations: eight combinations of predecode signals Xi(0) to Xi(7) and eight combinations of predecode signals Xk(0) to Xk(7), word line WL for which corresponding two predecode signals are both at H level is driven to a selected state, while the other word lines are driven into a non-selected state, thereby enabling execution of a word line selection of 64:1.

On the other hand, each row decode unit RDU does not drive corresponding node NB to a prescribed voltage when at least one of inputted predecode signals Xi and Xk is at L level.

Shift switches SW(0) to SW(63) control connections of nodes NB(0) to NB(63) with output nodes NA(0) to NA(63), NA(S1) and NA(S2) according to shift control signals SR, SL and SO generated, independently of each other, for each shift switch SW. For example, connection of shift switch SW(0) is controlled by shift control signals SR(0), SL(0) and SO(0).

Figure 6:
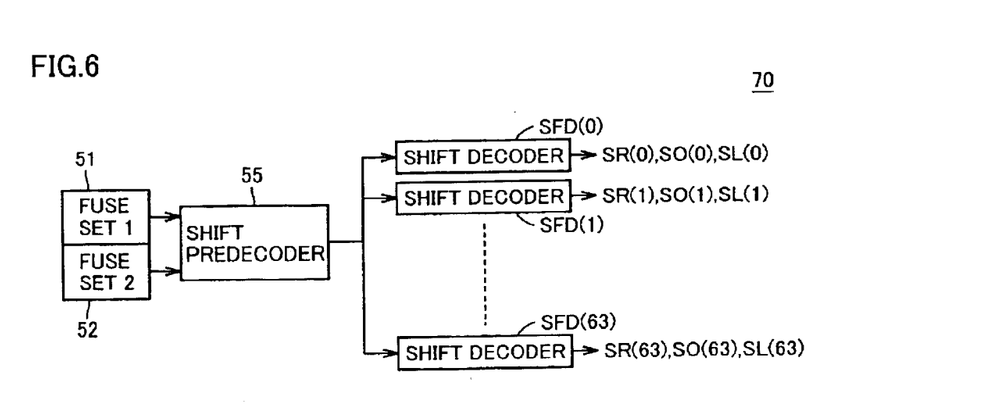
FIG. 6 is a block diagram showing a configuration of a shift control circuit generating a shift control signal.

FIG. 6 is a block diagram showing a configuration of a shift control circuit generating a shift control signal.

Referring to FIG. 6, shift control circuit 70 includes: fuse sets 51 and 52 for storing a row address of a defective word line corresponding to a defective memory cell; a shift predecoder 55 predecoding a row address stored on fuse sets 51 and 52; and shift decoders SFD(0) to SFD(63) for generating shift control signals SR(0), SO(0), SL(0) to SR(63), SO(63) and SL(63) corresponding to respective shift switches SW(0) to SW(63).

In the following description, in a case where shift control signals SR(0) to SR(63), SL(0) to SL(63) and SO(0) to SO(63) are collectively written, they are also simply presented as shift control signals SR, SL and SO, respectively. One of shift control signals SR, SL and SO is selectively set to H level in correspondence to each shift switch SW, while the other shift signals are set to L level, using shift decoders SFD(0) to SED(63).

Referring again to FIG. 5, when a corresponding shift control signal SO(i) is at H level, shift switch SW(i) is set to non-shift connection to connect node NB(i) to output node NA(i), (where i is an integer of 0 to 63).

Further, when shift control signal SL(i) is at H level, shift switch SW(i) is set to shift connection to L side (also referred to as "L side shift") to connect node NB(i) to output node NA(i−1). However, shift switch SW(0), when being set to L side shift, connects node NB(0) to output node NA(S1).

On the other hand, when shift control signal SR(i) is at H level, shift switch SW(i) is set to shift connection to R side (also referred to as "R side shift") to connect node NB(i) to output node NA(i+1). However, shift switch SW(63), when being set to R side shift, connects node NB(63) to output node NA(S2).

In a case where there is no defective word line, shift switches SW(0) to SW(63) are all set to non-shift connection and nodes NB(0) to NB(63) are connected to respective output nodes NA(0) to NA(63). In this case, since no necessity arises for selection of a spare row, output nodes NA(S1) and NA(S2) are not connected to any of nodes NB(0) to NB(63) and spare word lines SWL1 and SWL2 are all fixed in a non-selected state. Therefore, in a case where there is no defective word line, shift control signals SO(0) to SO(63) are all set to H level, while shift control signals SL(0) to SL(63), and SR(0) to SR(63) are all set to L level.

In contrast to this, in a case where there is a defective word line among word lines WL, shift switches SW(0) to SW(63) are controlled so as to be shifted in connection if necessary. With this shift, 64 output nodes NA corresponding to the other word lines excluding the defective word line and spare word lines SWL1 and SWL2 except for the defective word line are sequentially connected to respective nodes NB(0) to NB(63).

As a result, output node NA corresponding to a defective word line again designated by a defect address stored in fuse sets 51 and 52 is not connected to any of nodes NB(0) to NB(63), therefore the defective word line is fixed in a non-selected state. FIG. 5 shows an example of shift connection in a case where word line WL(0) and WL(2) are defective word lines.

In this case, in order to skip defective word line WL(0), shift switch SW(0) is set to L side shift to connect node NB(0) to output node NA(S1). Further, shift switch SW(1) is set to non-shift connection to connect node NB(1) to output NA(1). As a result, since output node NA(0) corresponding to defective word line WL(0) is not connected to any of nodes NB(0) to NB(63), defective word line WL(0) is fixed in a non-selected state.

Likewise, in order to skip defective word line WL(2), shift switches SW(2) to SW(63) are set to R side shift to connect nodes NB(2) to NB(63) to respective output nodes NA(3) to NA(63) and NA(S1). As a result, repair of defective memory cell on the basis of a row as a unit is realized so as to replace a defective word line with an adjacent word line by selecting 64 word lines as a total number of word lines WL and spare word lines SWL1 and SWL2 left after excluding defective word lines WL(0) and WL(2).

Note that setting of shift switch SW can be specifically determined according to an address of a defective memory cell. Therefore, for example, with a configuration in which shift control signals SR(0) to SR(63), SL(0) to SL(63) and SO(0) to SO(63) are generated based on a defect address row read from fuse sets by shift control circuit 70 and latched while the power supply of a semiconductor device is turned on, a shift connection state of shift switches SW(0) to SW(63) for replacement repair of a defective word line can be maintained during a time when the power supply is turned on. That is, redundancy repair of a defective memory cell row can be realized without executing redundancy determination in each access.

Then, description will be given of details of a configuration of word line select circuit 80.

Figure 7:
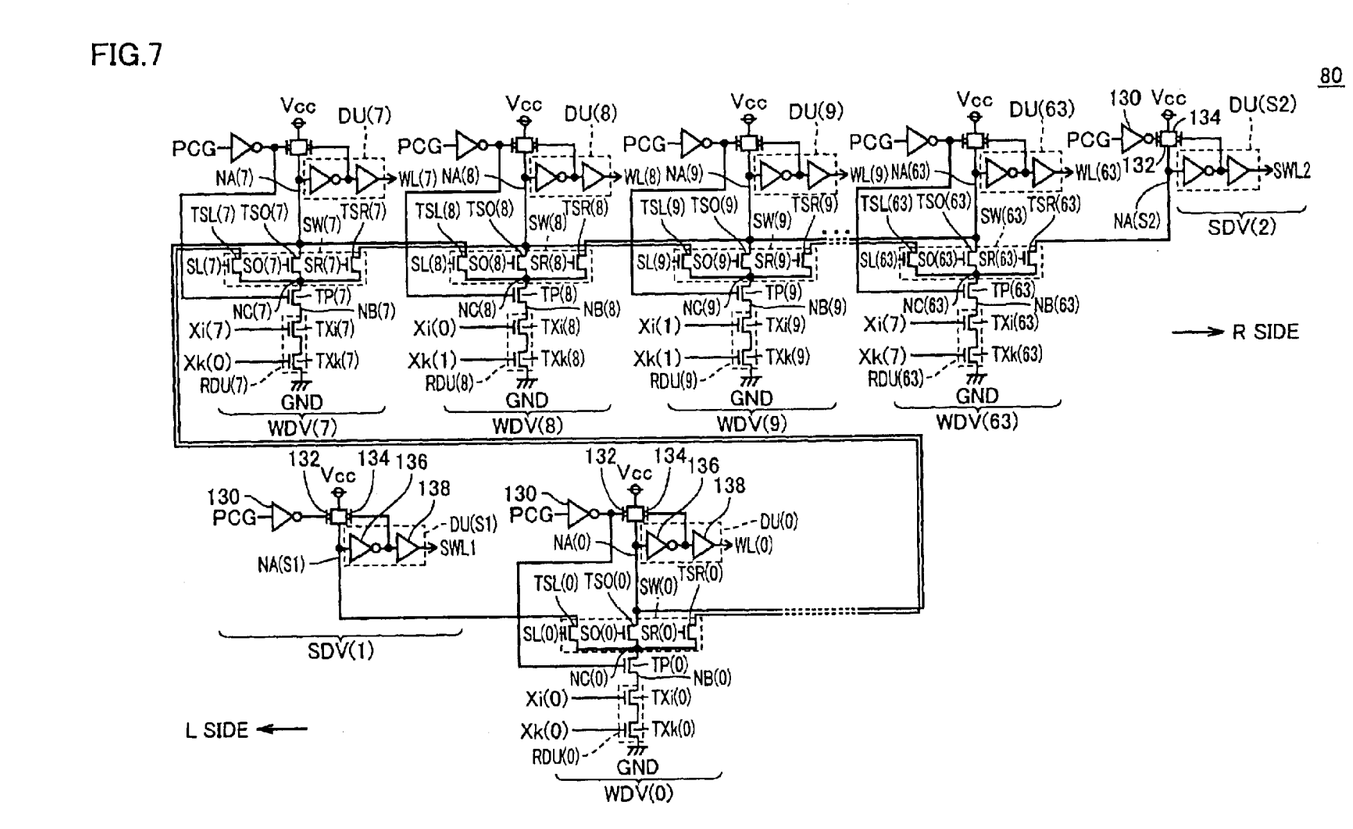
FIG. 7 is a circuit diagram showing details of a configuration of a word line select circuit shown in FIG. 1.

FIG. 7 is a circuit diagram showing details of a configuration of word line select circuit 80 shown in FIG. 1.

Referring to FIG. 7, word line select circuit 80 includes: spare word line drivers SDV(1) and SDV(2) provided correspondingly to respective spare word lines SWL1 and SWL2; and word line drivers WDV(0) to WDV(63) provided correspondingly to respective word lines WL(0) to WL(63).

Spare word line driver SDV(1) has: an inverter 130 inverting precharge signal PCG; precharge switches 132 and 134 connected in parallel between power supply voltage Vcc corresponding to H level and output node NA(S1); and a drive unit DU(S1) controlling a voltage on spare word line SWL1 according to a voltage at output node NA(S1). Drive unit DU(S1) has: an inverter 136 inverting a voltage at output node NA(S1); and a driver 138 driving spare word line SWL1 according to an output voltage of inverter 136. Driver 138 has a level shift function if necessary and is designed so as to drive a corresponding spare word line SWL1 to a boosted voltage higher than power supply voltage Vcc in a selected state thereof.

Precharge switches 132 and 134 each are a P-MOS transistor, wherein an output of inverter 130 is inputted to the gate of transistor 132 and an output of inverter 136 is inputted to the gate of transistor 134.

In spare word line driver SDV(2) as well, a configuration similar to spare word line driver SDV(1) is provided, in which an inverter 130, precharge switches 132 and 134, and a drive unit DU(S2) are provided to output node NA(2).

Further, in word line drivers WDV(0) to WDV(63) as well, inverters 130 each receiving precharge signal PCG; pairs of precharge switches 132 and 134, and driver units DU(0) to DU(63), shown in FIG. 5 as well, are provided correspondingly to respective output nodes NA(0) to NA(63).

In the following description, word line drivers WDV(0) to WDV(63) are also collectively written as word line driver WDV, spare word line drivers SDV(1) and SDV(2) are also collectively written as spare word line driver SDV and drive units DU(0) to DU(63) and DU(S1) and DU(S2) are also collectively written as drive unit DU.

Prior to the start of a row select operation during which precharge signal PCG is set to L level, output nodes NA(S1), NA(0) to NA(63) and NA(S2) are all precharged to power supply voltage Vcc (H level) by precharge switches 132 and 134. In response to this, spare word lines SWL1 and SWL2 and word lines WL(0) to WL(63) are all set in a non-selected state (L level).

In this situation, the row select operation gets started and when precharge signal PCG is set to L level, precharge switches 132 and 134 are turned off in each drive unit DU and output nodes NA(S1), NA(0) to NA(63) and NA(S2) are all disconnected from power supply voltage Vcc.

Each of word line driver units WDV has a shift switch SW also shown in FIG. 5; a row decode unit RDU and a control switch TP. In the following description, control switches TP(0) to TP(63) are included in respective word line driver WDV(0) to WDV(63) and control switches TP(0) to TP(63) are collectively written as simply control switch TP.

Since a configuration of each of word line driver WDV is similar to each other, description herein is given of details of word line driver WDV (8), as a representative, corresponding to word line WL(8).

Row decode unit RDU(8) has transistor switches TXi (8) and TXk(8) connected in series between ground voltage GND corresponding L level and node NB(8). Transistor switches TXi (8) and TXk(8) are respective N-MOS transistors and corresponding predecode signals Xi(0) and Xk(1) are inputted to the respective gates thereof. Control switch TP(8) is an N-MOS transistor connected between node NC(8) and node NB(8) and an output of inverter 130, that is an inverted signal of precharge signal PCG is inputted to the gate thereof. Therefore, control switch TP(8) is turned on and off complementarily to precharge switches 132 and 134, wherein control switch TP(8) is turned on in the row select operation while being turned off prior to the row select operation.

Shift switch SW(8) has: a transistor switch TSO(8) connected between output node NA(8) thereof and node NC(8); a transistor switch TSL(8) connected between node NC(8) thereof and output node NA(7) in word line driver WDV(7) to the left (L side) thereof and adjacent thereto; and a transistor switch TSR(8) connected between node NC(8) thereof and output node NA(9) in word line driver WDV(9) to the right (R side) thereof and adjacent thereto. Transistor switches TSO(8), TSL(8) and TSR(8) are respective N-MOS transistors and shift control signals SO(8), SL(8) and SR(8) are inputted to the respective gates thereof.

A similar configuration is provided to each of the other word line drivers WDV as well. In a word line driver WDV(0) in the most left side (L side), and adjacent to spare word line SWL1, transistor switch TSL(0) receiving shift control signal SL(0) at the gate thereof is connected between node NC(0) and output node NA(S1) corresponding to spare word line SWL1. On the other hand, transistor switch TSO(0) receiving shift control signal SO(0) at the gate thereof is provided between node NC(0) and output node NA(0). Transistor switch TSR(0) receiving shift control signal SR(0) at the gate thereof is connected between node NC(0) and output node NA(1) (not shown) corresponding to word line WL(1) to the right thereof and adjacent thereto (R side).

Likewise, in a word line driver WDV(63) in the most right side (R side) and adjacent to spare word line SWL2, transistor switch TSR(63) receiving shift control signal SR(63) at the gate thereof is connected between node NC(63) and output node NA(S2) corresponding to spare word line SWL2. On the other hand, transistor switch TSO(63) receiving shift control signal SO(63) at the gate thereof is provided between node NC(63) and output node NA(63). Transistor switch TSR(63) receiving shift control signal SL(63) at the gate thereof is connected between node NC(63) and output node NA(62) corresponding to word line WL (62) to the right thereof and adjacent thereto.

Transistor switches TXi (transistors TXi(0) to TXi(63) are collectively written as such) and transistor switches TXk (transistors TXk(0) to TXk(63) are collectively written as such) connected in series with each other in one of row decode units RDU(0) to RDU(63) are both turned on according to row address RA. As a result, only one of nodes NB(0) to NB(63) is driven to ground voltage GND (L level) according to row address RA and the other nodes are not driven to ground voltage GND.

Therefore, shift connection described in FIG. 5 is realized by combination of turning-on of each of control switches TP(0) to TP(63) and turning-on of one of transistor switches TSL, TSO and TSR of each of shift switches SW(0) to SW(63) to set one of a total of 64 lines including word lines WL except for a defective word line and spare word lines SWL1 and SWL2 in a selected state and the other are set to be in a non-selected state.

Figure 8:
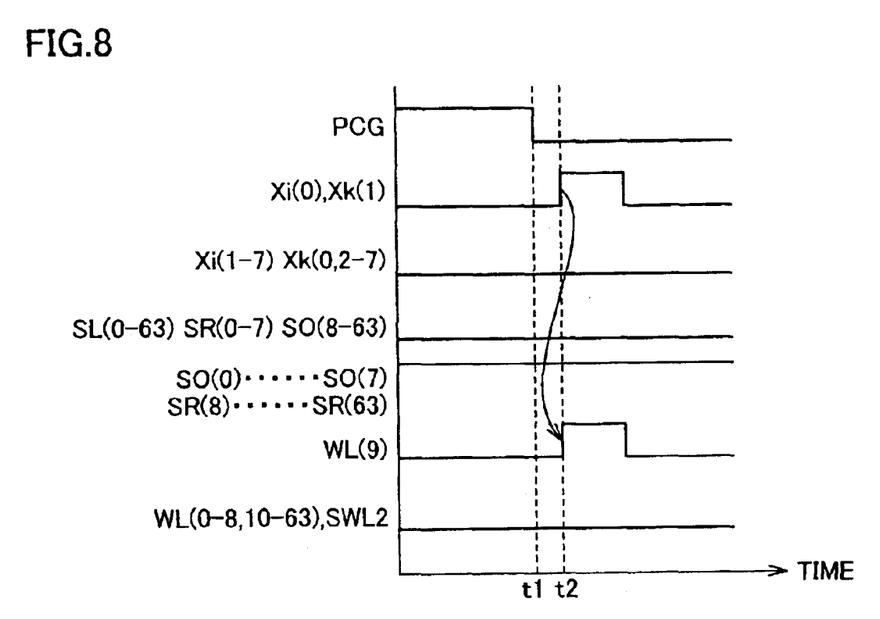
FIG. 8 is an operating waveform diagram describing a row select operation in the word line select circuit shown in FIG. 7.

FIG. 8 is an operating waveform diagram describing a row select operation in the word line select circuit shown in FIG. 7.

In FIG. 8, there is shown an operation example in which word line WL(8), which is a defective word line, is replaced with spare word line SWL2 by word line shift. In this case, shift switches SW(0) to SW(7) are set to be in a non-shift connection to connect nodes NB(0) to NB(7) to respective output nodes NA(0) to NA(7), while shift switches SW(8) to SW(63) are set to R side shift to connect node NB(8) to NB(63) to respective output nodes NA(9) to NA(63) and NA(S2). That is, shift control signals SO(0) to SO(7) and SR(8) to SR(63) are set to H level, while the other shift control signals SL(0) to SL(63), SR(0) to SR(7) and SO(8) to SO(63) are all set L level.

Referring to FIG. 8, prior to time point t1 when a row select operation gets started, precharge signal PCG is set to H level and in response to the setting, output nodes NA are all precharged to H level, therefore word lines WL(0) to WL(63) and spare word lines SWL1 and SWL2 are all driven into a non-selected state (L level).

At time point t1 when the row select operation gets started, precharge signal PCG is altered to L level and in response to the alteration, output nodes NA are disconnected from power supply voltage Vcc corresponding to H level.

Furthermore, row address RA originally corresponding to word line WL(8) is inputted, predecode signals Xi(0) and Xk(1) are set to H level and the other predecode signals Xi(1) to Xi(7) and Xk(0), Xk(2) to Xk(7) are all set to L level. In response to this, node NB(8) is driven to ground voltage GND and none of the other nodes NB(0) to NB(7) and NB(9) to NB(63) are driven to ground voltage GND.

Since node NB(8) has been, here, connected to output node NA(9) by setting shift switches SW(0) to SW(63) as described above, word line WL(9) is driven into a selected state (H level) at time point t2. On the other hand, the other word lines WL and spare word lines SWL1 and SWL2 are caused to be in a non-selected state (L level). In this way, there can be achieved a redundancy repair on the basis of a spare row as a unit with a small difference in access time between the presence and absence of a defect in a word line shift configuration in which a defective word line is replaced with an adjacent word line and a spare word line.

Referring again to FIG. 7, since selection and non-selection of word lines WL and spare word lines SWL1 and SWL2 are set according to voltages at output nodes NA, it is desirable that an unintentional variation in voltage at output node NA is small in order to execute stable row selection while avoiding occurrence of word line multi-selection.

Especially, by selectively turning on transistor switches TSL, TSO and TSR in each shift switch SW, each of output nodes NA excluding output node NA corresponding to defective word line is connected to a corresponding one of nodes NB through control switch TP even in the first access after power-on. At this point in time, since each node NB is at ground voltage GND level, there is a risk that, with a small capacitance of output node NA, in response to a transition of precharge signal PCG (to L level), a voltage at output node NA falls to thereby drive corresponding word line WL and spare word lines SWL1 and SWL2 into a selected state in error.

Further, as pointed out above, since in a word line shift configuration, a plurality of paths for enabling shift connection are provided to respective output nodes NA, there is a relatively high risk level of occurrence of a small leakage path to output node NA. Hence, in order to realize stable row selection in a word line shift configuration, it is desirable to secure a large charge capacitance at a precharge level at each output node NA so as to cause an unintentional variation in voltage to be small.

In the configuration according to the present invention shown in FIG. 7, output node NA and control switch (transistor) TP are connected to each other through a plurality of transistors TSL, TSO and TSR constituting shift switch SW. Hence, for each output node NA, parasitic capacitances (drain capacitances) of a total of four transistors including transistor switches TSL, TSO and TSR in connection and one control switch (transistor) TP in connection through shift switch SW and wire capacitance accompanying the configuration are secured as a charge capacitance at precharge level.

For example, for output node NA(9) of word line driver WDV(9), drain capacitances of a total of four transistors including transistor switches TSR(8), TSO(9) and TSL(10), and control switch TP(8) in connection through transistor switch TSR(8) in on state and wire capacitance accompanying the configuration are served as a charge capacitance at precharge level.

In comparison with the configuration of FIG. 7, an investigation is performed of a case of a configuration, as a comparative example, where in the configuration of FIG. 7, a connection sequence of control switches TP and shift switches SW is interchanged and control switch TP is placed between output node NA and shift switches SW (transistors TSO, TSR and TSL), with the result that in the comparative example, a charge capacitance of each output node NA can be secured only to a total of a drain capacitance of one transistor given by corresponding control switch TP and wire capacitance accompanying the configuration.

Therefore, with the configuration of a word line select circuit according to the present invention shown in FIG. 7 adopted, a charge capacitance of output node NA can be secured to a level at which there appears a voltage controlling selection/non-selection of word line WL and spare word line SWL. Therefore, an unintentional variation in voltage at output node NA is suppressed, thereby enabling stable row selection with a risk of word line multi-selection at a low level in a word line shift configuration.

Second Embodiment

While in the first embodiment, description is given of the configuration in which spare rows corresponding to respective spare word lines SWL1 and SWL2 are disposed on respective both sides of arrangement of a plurality of normal memory cells, the present invention can be similarly applied to a configuration in which spare rows are disposed on one side only.

Figure 9:
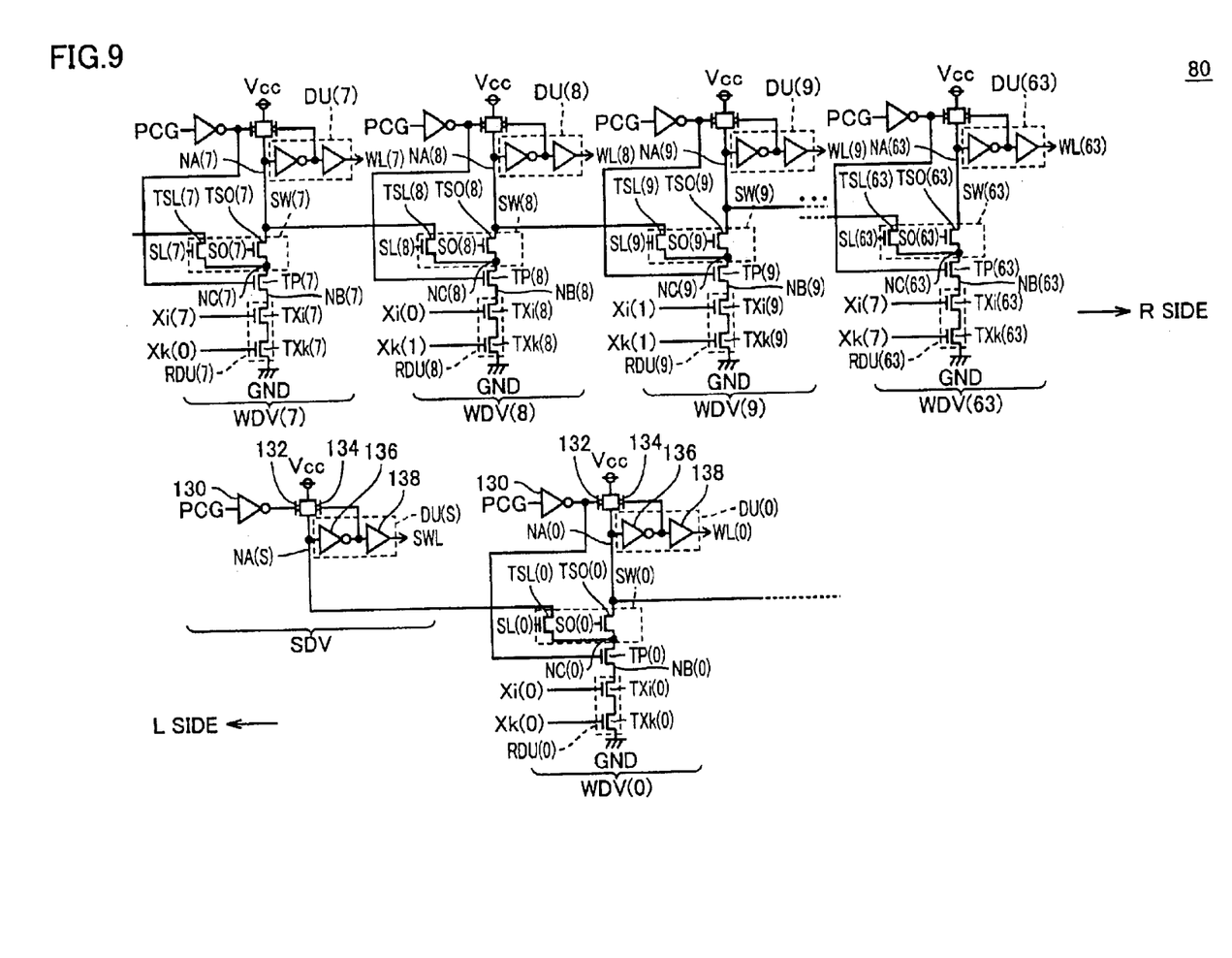
FIG. 9 is a circuit diagram showing details of a first configuration example of a word line select circuit according to a second embodiment.

FIG. 9 shows a configuration of a word line select circuit in a case where there is provided only a spare row corresponding to spare word line SWL adjacent to word line WL(0).

In such a configuration, since a spare row (spare word line SWL) is provided only on L side of word lines WL(0) to WL(63) corresponding normal memory cells, shift connection of each of shift switch SW(0) to SW(63) is necessary only to L side without requiring shift connection to R side.

Therefore, in the configuration shown in FIG. 9, it is only required to omit placement of transistor switch TSR in each of shift switch SW in the configuration of FIG. 7 in comparison between both configurations. That is, each shift switch SW is formed of node NB to which decode results are transmitted and transistor switches TSO and TSL provided between corresponding output node NA and output node NA on L side thereof and adjacent thereto. In each word line driver WDV, corresponding control signals SO and SL are inputted to the gates of respective transistors TSO and TSL. One of shift control signals SO and SL is selectively set to H level in each word line driver WDV so as to replace defective word line with shift connection to L side.

As for shift control signals SO and SL, to be concrete, in word line drivers WDV of defective word line and word lines in L side thereof, corresponding shift control signals SL are set to H level, while in word line drivers WDV in R side of defective word line, corresponding shift control signals SO are set to H level.

In FIG. 9, a configuration of spare word line driver SDV is similar to that of each of spare word line drivers SDV1 and SDV2 in FIG. 7 and the configuration of the other part except for shift switch SW in each word line driver WDV is again similar to that of FIG. 7, therefore, none of detailed descriptions thereof will be repeated.

Figure 10:
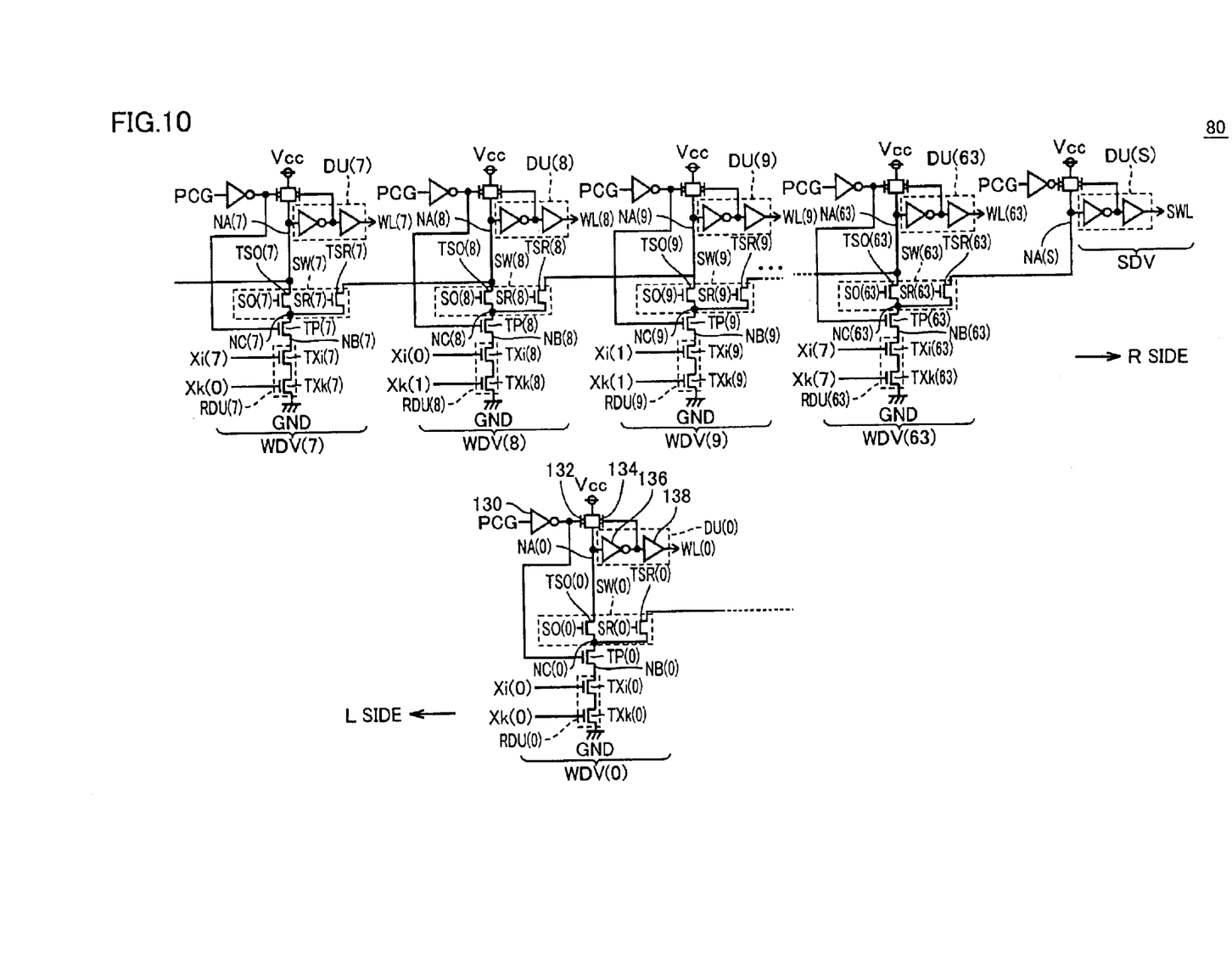
FIG. 10 is a circuit diagram showing details of a second configuration example of the word line select circuit according to the second embodiment.

Likewise, FIG. 10 shows a configuration of a word line select circuit in a case where there is provided only a spare row corresponding to spare word line SWL adjacent to word line WL(63).

In such a configuration, since a spare row (spare word line SWL) is provided only on the R side of word lines WL(0) to WL(63) corresponding to normal cells, shift connection of each of shift switches SW(0) to SW(63) is necessary only to R side without requiring shift connection to L side.

Therefore, in the configuration shown in FIG. 10, it is only required to omit placement of transistor switch TSL in each of shift switch SW in the configuration of FIG. 7 in comparison between both configurations. That is, each shift switch SW is formed of node NB to which decode results are transmitted and transistor switches TSO and TSR provided between corresponding output node NA and output node NA on R side thereof and adjacent thereto. In each word line driver WDV, corresponding control signals SO and SR are inputted to the gates of respective transistors TSO and TSR. One of shift control signals SO and SR is selectively set to H level in each word line driver WDV so as to replace defective word line with shift connection to R side.

As for shift control signals SO and SR, in word line drivers WDV of defective word line and word lines in R side thereof, corresponding shift control signals SR are set to H level, while in word line drivers WDV in L side of defective word line, corresponding shift control signals SO are set to H level.

In FIG. 10, a configuration of spare word line driver SDV is similar to that of each of spare word line drivers SDV1 and SDV2 in FIG. 7 and the configuration of the other part except for shift switch SW in each word line driver WDV is again similar to that of FIG. 7, therefore, none of detailed descriptions thereof will be repeated.

In this way, even in the configuration in which a spare row is provided only on one side of a memory cell array, a word line select circuit can be constructed with a high effect of preventing word line multi-selection, similar to the first embodiment.

Note that, though details are not shown, the word line select configuration according to the first embodiment can be applied to a word line shift configuration including three or more spare rows. In this case, a necessity arises for further increasing the number of possible shifts in each shift switch SW correspondingly to the number of disposed spared rows.

For example, in a word line shift configuration with J (which is a natural number), spare rows (that is spare word lines) included, it is required that each shift switch SW is provided with (J+1) transistor switches to thereby selectively control connection between corresponding output node NA of each word line driver and nodes NB of corresponding word line driver and adjacent J word line drivers.

Further, while in the first and second embodiments, there are shown configurations in which spare rows are disposed at both or one end of a memory cell array, application of the present is not specifically limited on location of spare rows. That is, the present invention can be applied to any configuration without placing a limitation on location of spare rows as far as in the configuration, word line drivers WDV and spare word line drivers SDV are disposed so as to be in one-to-one correspondence to word lines and spare word lines in placement sequence and connection in shift switches SW, that is shift control signals are properly set according to a relationship in position between a defective word line and a spare word line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in rows and columns and a plurality of spare memory cells arranged so as to form first and second spare rows in respective regions adjacent to said plurality of memory cells;
   a plurality of word lines provided correspondingly to respective rows of said plurality of memory cells;
   first and second spare word lines provided correspondingly to said first and second spare rows, respectively;
   a plurality of word line drivers provided correspondingly to said respective plurality of word lines to each control a voltage on a corresponding one of said plurality of word lines; and
   first and second spare word line drivers provided correspondingly to said first and second spare word lines, respectively, to control voltages on said first and second spare word lines, wherein
   said plurality of word line drivers and said first and second spare word line drivers are sequentially disposed in accordance with arrangement of said plurality of word lines and said first and second spare word lines in said memory cell array,
   each of said plurality of word line drivers and said first and second spare word line drivers includes:
      an output node;
      a drive circuit driving a corresponding one of said plurality of word lines and said first and second spare word lines into one of a selected state and a non-selected state according to a voltage at said output node; and
      a precharge switch precharging said output node to a first voltage prior to a row select operation and, also, disconnecting said output node from said first voltage in said row select operation,
   each of said plurality of word line drivers further includes:
      a decode unit connecting a first internal node to a second voltage in said row select operation according to a result of row selection;
      a control switch provided between a second internal node and said first internal node to connect both to each other in said row select operation and, also, disconnect both from each other prior to said row select operation;
      a first shift switch connected between one output node adjacent to said output node of a corresponding one of said plurality of word line drivers on a first side along a direction of arrangement of said plurality of word line drivers and said first and second spare word line drivers, and said second internal node of said corresponding one of said plurality of word line drivers;
      a second shift switch connected between said output node of said corresponding one of said plurality of word line drivers, and said second internal node of said corresponding one of said plurality of word line drivers; and
      a third shift switch connected between one output node adjacent to said output node of said corresponding one of said plurality of word line drivers on a second side opposite to said first side, and said second internal node of said corresponding one of said plurality of word line drivers, and
   said semiconductor memory device further comprises a shift control circuit controlling turning-on and -off of said first to third shift switches in each of said plurality of word line drivers in said row selection operation on the basis of an address of a defective memory cell row.

2. The semiconductor memory device according to claim 1, wherein
   when a defective memory cell row is present, said shift control circuit controls turning-on and -off of said first to third shift switches in each of said plurality of word line drivers so that said output node of the word line driver for a defective word line corresponding to said defective memory cell row is disconnected from said second internal node of any of said plurality of word line drivers, and said output node of at least one of said first and second spare word lines and the output nodes corresponding to the other respective word lines except for said defective word line are connected to respective second internal nodes of said plurality of word line drivers.

3. The semiconductor memory device according to claim 1, wherein
   said drive circuit drives the corresponding one of said plurality of word lines and said first and second spare word lines into said non-selected state when the corresponding output node is at said first voltage and, also, drives said corresponding one word line into said selected state when said corresponding output node is at said second voltage.

4. The semiconductor memory device according to claim 1, wherein said decode switch connects said first internal output node and said second voltage in one of said plurality of word line drivers according to said result of row selection and, also, disconnects said first internal node from said second voltage in each of the other word line drivers.

5. A semiconductor memory device comprising:

a memory cell array including a plurality of memory cells arranged in rows and columns and a plurality of spare memory cells arranged so as to form J spare rows (where J is a natural number);

a plurality of word lines provided correspondingly to respective rows of said plurality of memory cells;

J spare word lines provided correspondingly to said respective J spare rows;

a plurality of word line drivers provided correspondingly to said respective plurality of word lines to each control a voltage on a corresponding one of said plurality of word lines; and J spare word line drivers provided correspondingly to said respective J spare word lines to each control a voltage on a corresponding one of said J spare word lines, wherein said plurality of word line drivers and said J spare word line drivers are sequentially arranged in accordance with arrangement of said plurality of word lines and said J spare word lines in said memory cell array, each of said plurality of word line drivers and said J spare word line drivers includes:

an output node;

a drive circuit driving a corresponding word line or a spare word line into one of a selected state and a non-selected state according to a voltage at said output node; and a precharge switch precharging said output node to a first voltage prior to a row select operation and, also, disconnecting said output node from said first voltage in said row select operation, each of said plurality of word line drivers further includes:

a decode switch connecting a first internal node to a second voltage according to a result of row selection;

a control switch provided between said first internal node and a second internal node to connect both to each other in said row select operation and, also, disconnect both from each other prior to said row select operation; and (J+1) shift switches, respectively, provided between said output node of a corresponding one of said plurality of word line drivers and output nodes of adjacent J ones among the other word line drivers and said J spare word line drivers, and said second internal node of said corresponding one of said plurality of word line drivers, and, in said row select operation, one of which is selectively turned on, while the other of which are turned off, and said semiconductor memory device further comprises a shift control circuit controlling turning-on and -off of said (J+1) shift switches in each of said plurality of word line drivers in said row selection operation on the basis of an address of a defective memory cell row.

6. The semiconductor memory device according to claim 5, wherein when said defective memory cell row is present, said shift control circuit controls turning-on and -off of said (J+1) shift switches in each of said plurality of word line drivers so that said output node of the word line driver for a defective word line corresponding to said defective memory cell is disconnected from said second internal node of any of said plurality of word line drivers, and said output node of at least one of said J spare word lines and the output nodes corresponding to the other respective word lines except for said defective word line are connected to respective second internal nodes of said plurality of word line drivers.

7. The semiconductor memory device according to claim 5, wherein said drive circuit drives the corresponding one of said plurality of word lines or the corresponding one of said J spare word lines into said non-selected state when said corresponding output node is at said first voltage and, also, drives said corresponding one word line or said corresponding one of J spare word lines into said selected state when said corresponding output node is at said second voltage.

8. The semiconductor memory device according to claim 5, wherein said decode switch connects said first internal output node and said second voltage to each other in one of said plurality of word line drivers according to said result of row selection and, also, disconnects said first internal node from said second voltage in each of the other word line drivers.

* * * * *